(12) United States Patent
Gailus et al.

(10) Patent No.: US 7,484,971 B2
(45) Date of Patent: Feb. 3, 2009

(54) ELECTRONIC COMPONENT WITH HIGH DENSITY, LOW COST ATTACHMENT

(75) Inventors: Mark W. Gailus, Somerville, MA (US); Leon M. Khilchenko, Manchester, NH (US)

(73) Assignee: Amphenol Corporation, Wallingford, CT (US)

( * ) Notice: Subject to any disclaimer, the term of this patent is extended or adjusted under 35 U.S.C. 154(b) by 4 days.

(21) Appl. No.: 11/604,289

(22) Filed: Nov. 27, 2006

(65) Prior Publication Data

US 2007/0207635 A1    Sep. 6, 2007

Related U.S. Application Data

(60) Provisional application No. 60/741,089, filed on Nov. 29, 2005.

(51) Int. Cl.
*H01R 9/09* (2006.01)
(52) U.S. Cl. .................................................. 439/83
(58) Field of Classification Search ............... 439/83, 439/876; 228/180.21; 361/760, 773
See application file for complete search history.

(56) References Cited

U.S. PATENT DOCUMENTS

| | | | |
|---|---|---|---|
| 2,206,662 A * | 7/1940 | Conradi et al. ................ 29/885 |
| 4,607,782 A | 8/1986 | Mims | |
| 4,732,565 A * | 3/1988 | Ito et al. ....................... 439/79 |
| 4,787,853 A * | 11/1988 | Igarashi ....................... 439/55 |
| 4,923,405 A * | 5/1990 | Munsterman et al. ......... 439/78 |
| 4,927,372 A * | 5/1990 | Collier ......................... 439/83 |
| 4,949,163 A * | 8/1990 | Sudo et al. ................... 257/698 |
| 4,955,820 A * | 9/1990 | Yamada et al. ................ 439/83 |
| 4,970,570 A * | 11/1990 | Agarwala et al. ............. 257/735 |
| 4,990,402 A | 2/1991 | Kneringer et al. | |
| 5,106,328 A * | 4/1992 | Prochaska et al. ............ 439/751 |
| 5,122,064 A | 6/1992 | Zarreii | |
| 5,241,134 A | 8/1993 | Yoo | |
| 5,375,320 A | 12/1994 | Kinsman et al. | |
| 5,403,206 A | 4/1995 | McNamara et al. | |
| 5,484,310 A | 1/1996 | McNamara et al. | |
| 5,595,490 A | 1/1997 | Cohen et al. | |
| 5,607,326 A | 3/1997 | McNamara et al. | |
| 5,730,630 A | 3/1998 | Lacourse et al. | |
| 5,823,830 A * | 10/1998 | Wurster ....................... 439/751 |
| 6,042,386 A | 3/2000 | Cohen et al. | |
| 6,152,742 A | 11/2000 | Cohen et al. | |
| 6,152,747 A | 11/2000 | McNamara | |
| 6,181,219 B1 | 1/2001 | Gailus et al. | |
| 6,394,822 B1 | 5/2002 | McNamara | |

(Continued)

*Primary Examiner*—Neil Abrams
(74) *Attorney, Agent, or Firm*—Blank Rome LLP

(57) ABSTRACT

A contact tail for an electronic component compatible with surface mount manufacturing techniques. The contact tail is stamped, providing a relatively low manufacturing cost and high precision. High precision in the contact tails in turn provides more reliable solder joints across an array of contact tails in an electronic component. Further, the contact tail may be shaped to reduce the propensity for solder to wick from the attachment area during a reflow operation. Reducing the propensity of solder to wick reduces the chance that solder will interfere with the operation of the electronic component. Additionally, reducing the propensity for solder to wick allows pads to which the contact tail is attached to be positioned over vias, thereby increasing the density with which contacts may be attached to a substrate. The reliability with which electronic assemblies incorporating components using the contact tail is also increased when the contact tail is used in self-centering arrays.

31 Claims, 6 Drawing Sheets

U.S. PATENT DOCUMENTS

| | | |
|---|---|---|
| 6,530,790 B1 | 3/2003 | McNamara et al. |
| 6,537,087 B2 | 3/2003 | McNamara et al. |
| 6,593,535 B2 * | 7/2003 | Gailus .................. 174/262 |
| 6,641,410 B2 | 11/2003 | McNamara et al. |
| 6,660,946 B2 | 12/2003 | Saiki et al. |
| 6,776,659 B1 | 8/2004 | Stokoe et al. |
| 6,780,059 B1 | 8/2004 | Payne et al. |
| 6,814,619 B1 | 11/2004 | Stokoe et al. |
| 6,827,611 B1 | 12/2004 | Payne et al. |
| 6,908,328 B2 | 6/2005 | Lei et al. |
| 7,198,736 B2 | 4/2007 | Kasuga et al. |
| 7,240,425 B2 | 7/2007 | Khilchenko et al. |

* cited by examiner

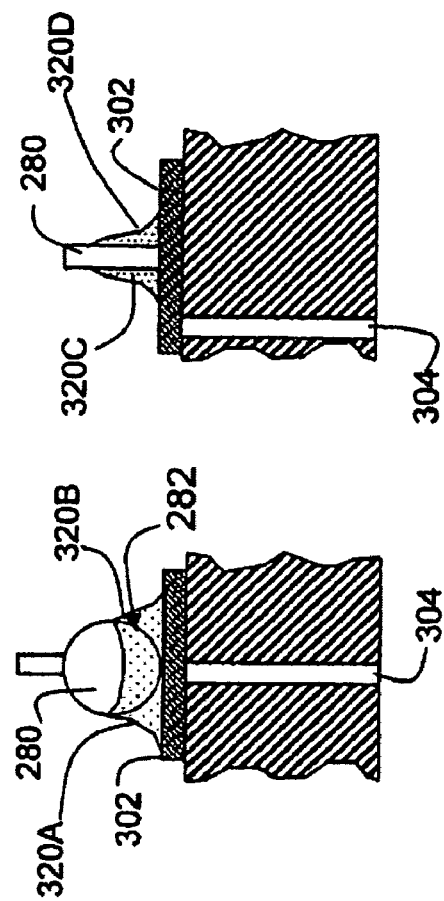
FIG. 3C
FIG. 3B
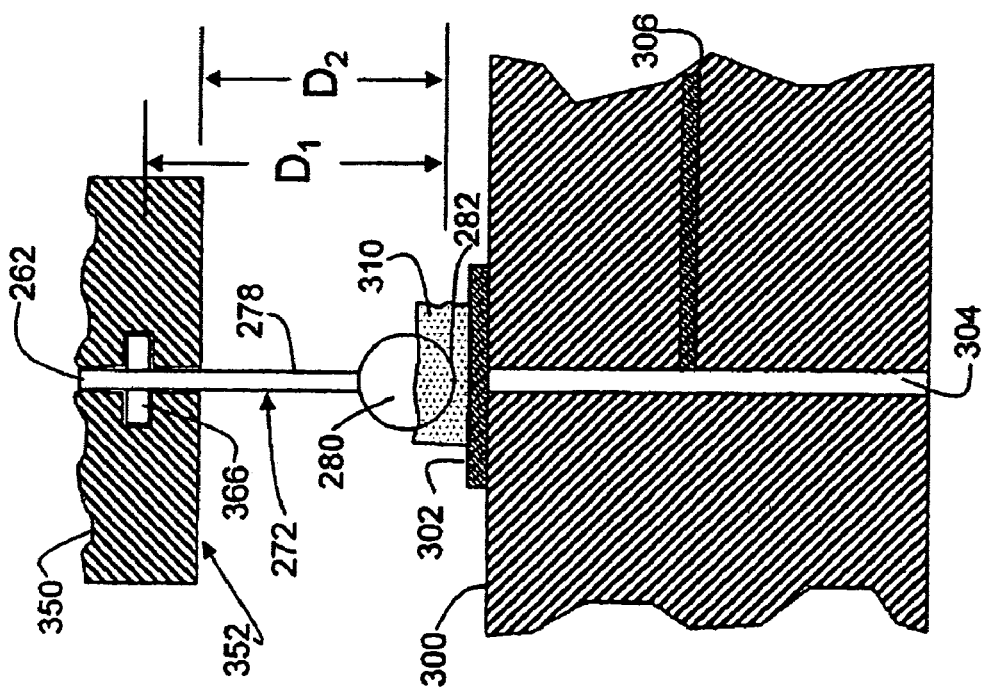
FIG. 3A

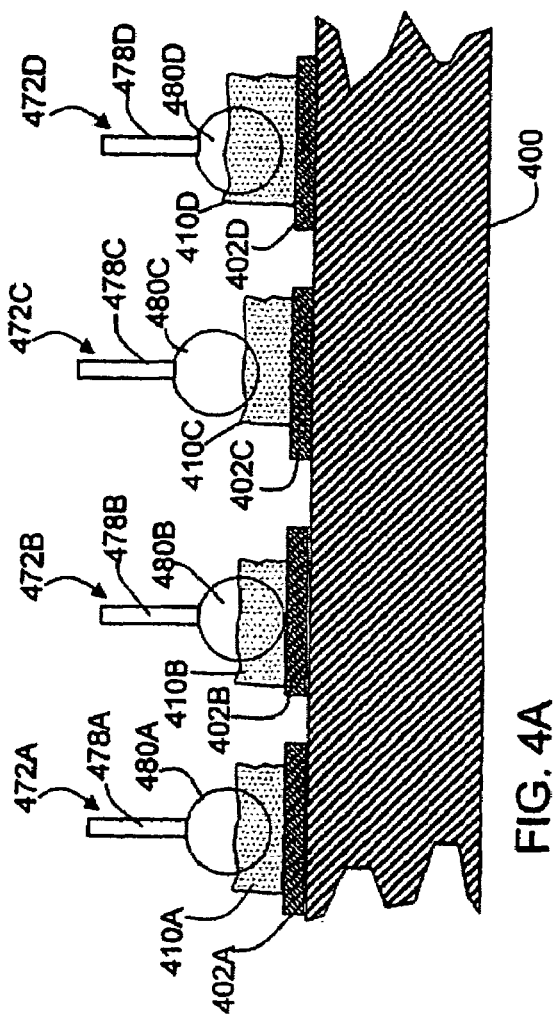
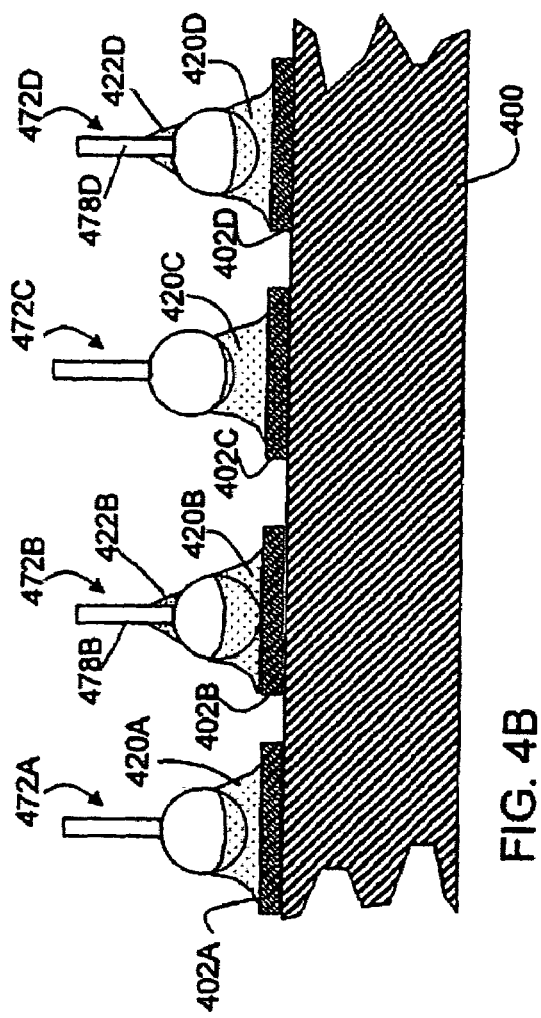
FIG. 4A
FIG. 4B

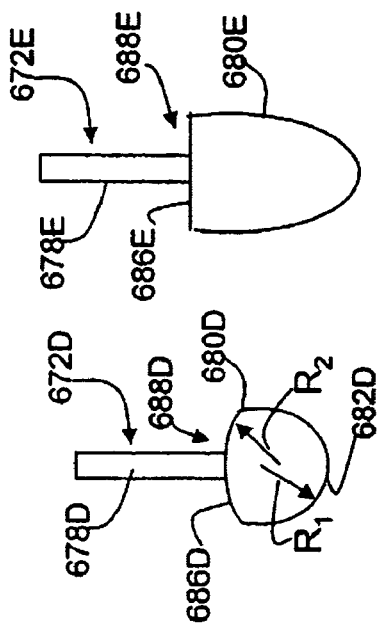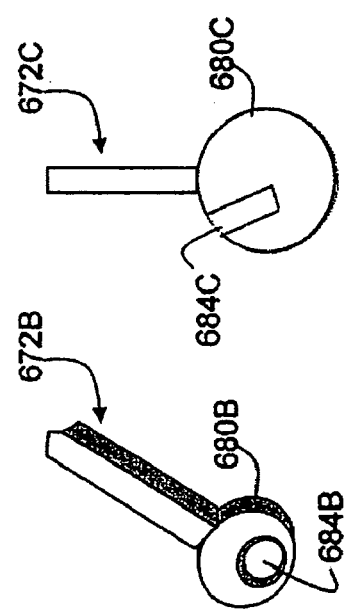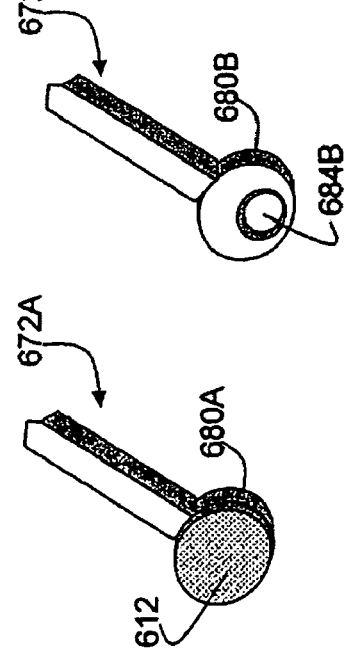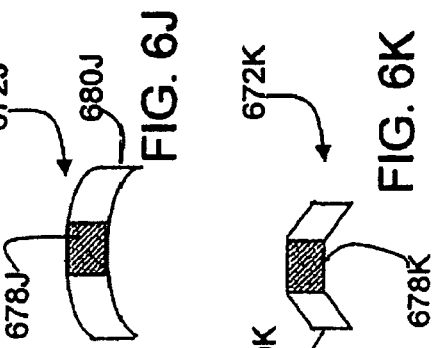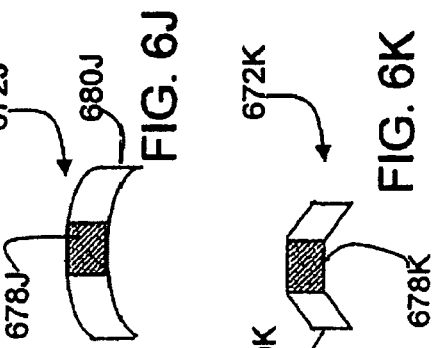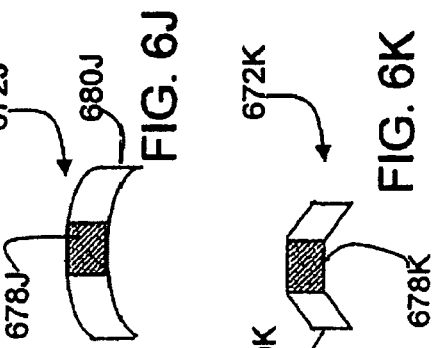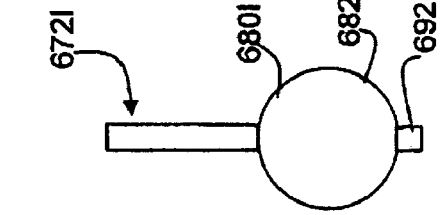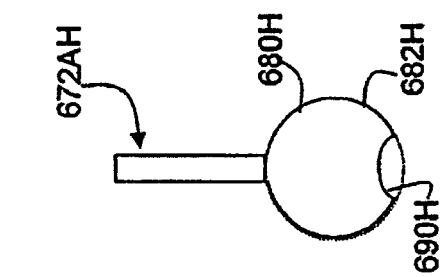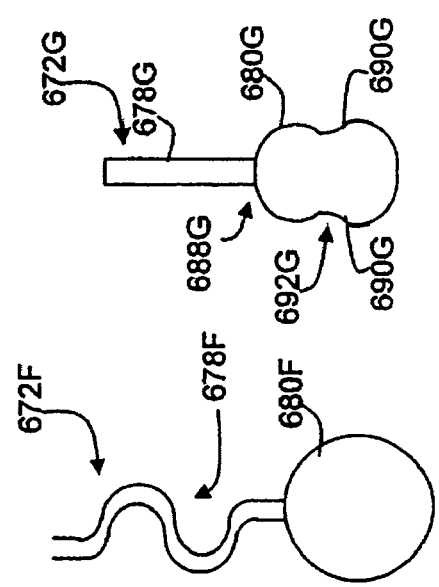

ELECTRONIC COMPONENT WITH HIGH DENSITY, LOW COST ATTACHMENT

This application claims priority from U.S. Provisional Patent Application No. 60/741,089, filed Nov. 29, 2005, which is incorporated herein by reference.

FIELD OF INVENTION

This invention relates generally to electronic assemblies and more specifically to the attachment of electronic components to substrates.

BACKGROUND OF THE INVENTION

Electronic assemblies are traditionally manufactured by attaching components to substrates, such as printed circuit boards. The substrates provide mechanical support for the components and have signal paths that electrically interconnect the components. In printed circuit boards and other types of substrates, signal paths between components are provided by conducting strips, called "traces." Often, traces are internal to the printed circuit board and holes, called "vias," extend from a surface of the printed circuit board to the traces. The vias are plated with conductive material to create an electrical connection between a component on the surface of the printed circuit board and a trace within the board.

The mechanism attaching components to the substrate should have desirable electrical and mechanical attributes. The attachment should electrically connect components to the vias in a way that provides little distortion of electrical signals passing between the component and traces of the substrate. Further, the attachment between the component and the substrate should be mechanically robust so that the electrical connection is not disrupted by forces on the interface between the component and the substrate as the electronic assembly is used. Many types of attachments have been used.

Early electronic assemblies were manufactured using a through-hole solder attachment technique. With this form of attachment, leads from components on the front side of a printed circuit board are inserted through the vias. Solder is applied to the back of the printed circuit board, often by dipping the leads in a solder bath. Molten solder tends to adhere to the metal of the lead and the plating of the via. Attractive forces between the molten solder and the lead draw the solder along the lead in a process sometimes called "wicking." When the solder cools and hardens, it makes electrical connection between the lead and the plating of the via and it also secures the lead in the via.

Press-fit connections have also been used. A press-fit connection also uses a via for attachment, but relies on force generated by a contact tail to couple the contact tail to the via. A press-fit lead is stamped with a contact tail that has a compliant section. The compliant section is compressed as the lead is inserted into the via. Once inside the via, the complaint section generates a spring force against the walls of the via. The force creates both an electrical connection and a mechanical connection between the contact tail and the walls of the via.

More recently, surface mount techniques have become widely used. With surface mount techniques, vias are also used to make connections to traces within the printed circuit board. The vias serve only as conducting paths between pads on the surface of the printed circuit board and traces (or other conductors such as ground planes or power planes) internal to the printed circuit board. Because the vias do not receive leads or contact tails from components to be attached, the vias can often be made smaller in diameter than those used for through-hole or press-fit attachment. Smaller diameters allow the vias to be placed closer together or can be positioned to allow more traces to be routed between vias in the area of the substrate where components are mounted. Either effect can lead to a smaller electronic assembly. Smaller diameter vias may also permit improved electrical performance to be obtained.

Electronic components are attached by soldering leads from the components to the pads on the surface of the substrate. Such leads are often stamped from flat pieces of metal and then bent or "formed" into shapes. Commonly used shapes include "gull wing" leads and "J-leads." Though, in some instances, the leads may be simply posts that are not formed. Regardless of the shape, the leads are typically soldered to the pads using a reflow solder process.

In a reflow process, solder paste is positioned on the pad. Solder paste is viscous enough to hold a lead loosely in place when a component is placed on the board. Once components are placed on the board, the board is placed in an oven that heats the solder paste.

A fluxing agent and solder particles within the solder paste are transformed during heating. As the solder paste is heated, the fluxing agent becomes activated. At the beginning of the reflow process, the flux attacks oxide and other contaminants on the surfaces of the pad and the lead being interconnected. The flux also "wets" the surfaces to promote solder adhesion. As the flux is heated more, it turns into a gas that should escape from the solder paste. Simultaneously, the solder particles within the paste melt. The molten solder adheres to both the lead and the pad. When the molten solder cools, it solidifies to electrically and mechanically join the lead to the pad.

Surface mount techniques have also been developed using solder balls. In many cases, electronic components attached with solder balls do not have leads. Instead, both the component and the substrate have pads that align. Solder balls are placed between the pads and reflowed to secure the pads on the component to the pads on the substrate. Solder paste or flux may be used to hold the solder balls in place. As with other surface mounting techniques, the solder balls are reflowed and molten solder adheres to the pad on the substrate and the pad on the component. When the solder cools, it forms an electrical and mechanical connection between the pads.

Many variations of solder ball mounting are known. In some variations, the solder balls have solid cores, such as copper spheres. The spheres shape the solder joint and establish a spacing between the component and the substrate when soldered.

Surface mount techniques are often used when very high density interconnections are desired. Because there is no need for access to the pads to make a solder joint, arrays of pads can be formed on a substrate and a component may be placed over the array of pads. Many electronic components are manufactured with an array of solder balls to align with such an array of pads. These components are often said to include "Ball Grid Array" (BGA) packaging.

It would be desirable to have an attachment mechanism for electronic components that provides the advantages of BGA packaging, but is simpler to manufacture and therefore lower in cost.

SUMMARY OF INVENTION

In one aspect, the invention relates to a contact tail for a conductive member in an electronic component. The contact tail comprises a shaft portion adapted to extend from the component in a first direction. The shaft portion has a first width normal to the first direction. The contact tail also includes a distal portion attached to the shaft portion. The distal portion has a major surface parallel to the first direction and a second width in a direction normal to the first direction. The second width is greater than the first width.

In another aspect, the invention relates to a contact tail for a conductive member in an electronic component. The contact tail has a shaft portion adapted to extend from the component in a first direction. The contact tail also has a distal portion, having a first edge and a second edge. The first edge and the second edge are separated in the first direction and disposed on opposing sides of the distal portion. The distal portion is attached to the shaft portion at the second edge, with the second edge extending beyond the shaft in at least one direction transverse to the first direction.

In another aspect, the invention relates to a method of forming a contact. The method includes stamping from a sheet of metal a contact with a contact tail. The contact tail has a shaft portion adapted to extend from the component in a first direction, the shaft portion having a first width normal to the first direction; and a distal portion, attached to the shaft portion, the distal portion having a second width normal to the first direction, greater than the first width, and an edge, normal to the first direction.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3A is a sketch of a contact tail of the lead frame of FIG. 2 in one stage of manufacture of an electronic assembly;

FIG. 3B is a sketch of the contact tail of FIG. 3A in a subsequent stage of manufacture of an electronic assembly;

FIG. 3C is a side view of a portion of the contact tail shown in FIG. 3B;

FIG. 4A is a sketch of an array of contact tails in a stage of manufacture of an electronic assembly;

FIG. 4B is a sketch of the array of contact tails of FIG. 4A in a later stage of manufacture;

FIG. 6A is a sketch of a contact tail according to an alternative embodiment of the invention;

FIG. 6B is a sketch of a contact tail according to an alternative embodiment of the invention;

FIGS. 6C-6I are sketches of front views of contact tails according to alternative embodiments of the invention; and FIGS. 6J and 6K are sketches of top views of alternative embodiments of contact tails according to alternative embodiments of the invention.

DETAILED DESCRIPTION

Figure 1A:
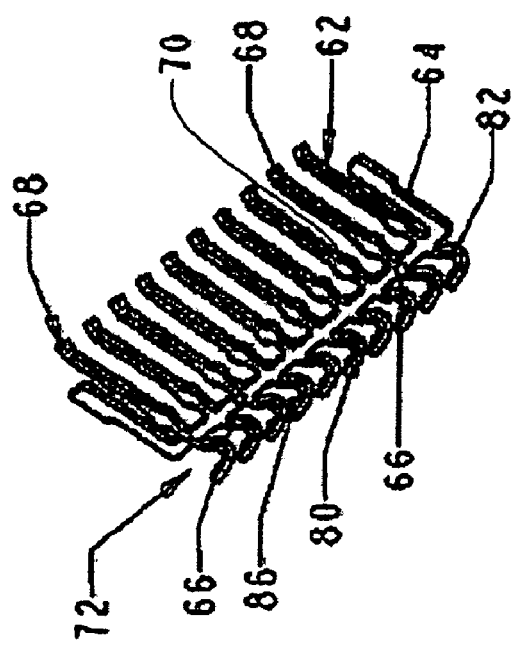
FIG. 1A is a sketch of a lead frame from a prior art electrical connector.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In manufacturing electronic assemblies, it would be desirable to have a low cost and reliable method for attaching components to substrates. In addition, it would be desirable for the low cost, reliable attachment method to allow for a high density of interconnections. As is described in the above background, ball grid arrays have been used to attach components to substrates. Ball grid arrays are desirable because they provide for a relatively large number of interconnections between a component and a substrate in a relatively small area. For example, ball grid arrays have been used to attach packaged semiconductor components as well as other components, such as electrical connectors and chip sockets. We have developed an attachment system for electronic components that has the density advantages of a ball grid array, but is low cost and reliable. The attachment system is particularly useful for components with leads, such as connectors and sockets.

Figure 1B:
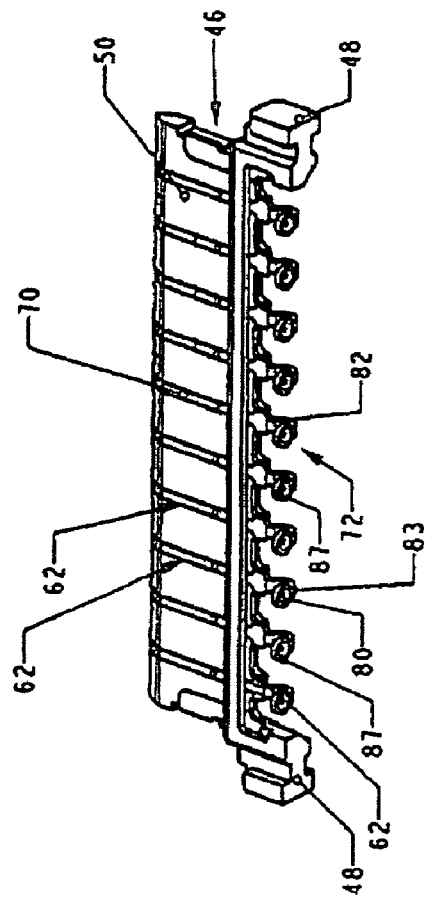
FIG. 1B is a sketch of a prior art connector component incorporating the lead frame of FIG. 1A.

FIGS. 1A and 1B show portions of a prior art electrical connector designed for attachment to a printed circuit board using a ball grid array. FIG. 1A shows a lead frame 64 designed to be incorporated into a connector with ball grid array attachment. Lead frame 64 may, for example, be stamped from a sheet of metal to create a structure of the desired profile. The structure may then be formed to incorporate bends and curves or other shapes as appropriate.

In the illustrated configuration, the stamping operation produces multiple signal conductors 62. Each signal conductor has a mating contact portion 68, an intermediate portion 70 and a contact tail 72. Mating contact portion 68 is shaped to make contact with a corresponding signal conductor in a mating connector portion. Contact tail 72 is shaped for attachment to a substrate, such as a printed circuit board, using solder balls. Intermediate portion 70 provides a signal path between contact tail 72 and mating contact portion 68.

When lead frame 64 is stamped, the individual conductors 62 are initially joined by tie bars 66. Tie bars 66 facilitate easy handling of the conductors 62 as a group. Tie bars 66 are severed at a subsequent stage of manufacture of the connector to produce electrically separate conductors 62.

FIG. 1B shows lead frame 64 assembled into a component 46. In this example, component 46 is a wafer that may be used to assemble a stacking or mezzanine-style electrical connector such as is pictured in U.S. Pat. No. 6,537,087, which is hereby incorporated by reference.

The component includes an insulative housing 50 molded around the signal conductors 62 of lead frame 64. The mating contact portions 68 and contact tails 72 are exposed in housing 50. Housing 50 may also include features, such as shoulders 48, for mounting or positioning component 46. In the pictured embodiment, shoulders 48 allow component 46 to be inserted into an organizer with other similar wafers and also sets a spacing between component 46 and a substrate to which component 46 may be attached.

Each of the conductors 62 includes a contact tail 72. In the illustrated embodiment, each of the contact tails 72 is shaped to received a solder ball (not shown). When components 46 are assembled into an organizer, pads 80 of contact tails 72 are positioned generally in parallel so that solder balls on pads 80 may make contact with an array of pads on the surface of a printed circuit board. In this configuration, the pads 80 are generally bent in a direction approximately perpendicular to the axis of the conductors 62 such that the pads 80 lays parallel with the surface of the circuit board while the conductors are approximately perpendicular to the circuit board.

The contact tails 72 may be shaped to aid in retaining a solder ball. For example, each pad 80 may be formed with a dimple 86 that aids in securing a solder ball to the pad. Additionally, edges such as 87 and 83 aid in retaining solder on the pads 80. Each of the pads 80 may also be coated with solder wettable material to further aid in retaining solder on the pads 80.

We have recognized a difficulty with the component configuration illustrated in FIGS. 1A and 1B. When the pads 80 are parallel to the substrate (or circuit board) to which the component 46 is to be mounted, to form reliable solder joints, each of the pads 80 must be formed with a precise position so that the spacing between each pad and the substrate to which component 46 is to be mounted is tightly controlled. If a pad is too far from the substrate, molten solder may not bridge the gap between the pad on the substrate and the pad on the component. Conversely, if the pad on the component is too close to the pad on the substrate, molten solder may be squeezed out of the intended joint area and create a short circuit to other pads on the substrate or may wick up contact tail 72 and interfere with operation of component 46.

However, contact tails 72 have a shape that is difficult to simply and at low cost manufacture with high precision. Contact tails 72 are shaped in a forming operation in which a flat sheet of metal is bent into the desired shape in a forming die. It is difficult to tightly control the positioning of pads 80 in a forming operation. The metal used to form lead frame 64 has some springiness. As part of the forming operation, the metal is bent into a shape that is projected to spring back to the desired shape when the lead is released from the forming die. Any variability in the material or forming process decreases the precision with which pads 80 are positioned.

Figure 2:
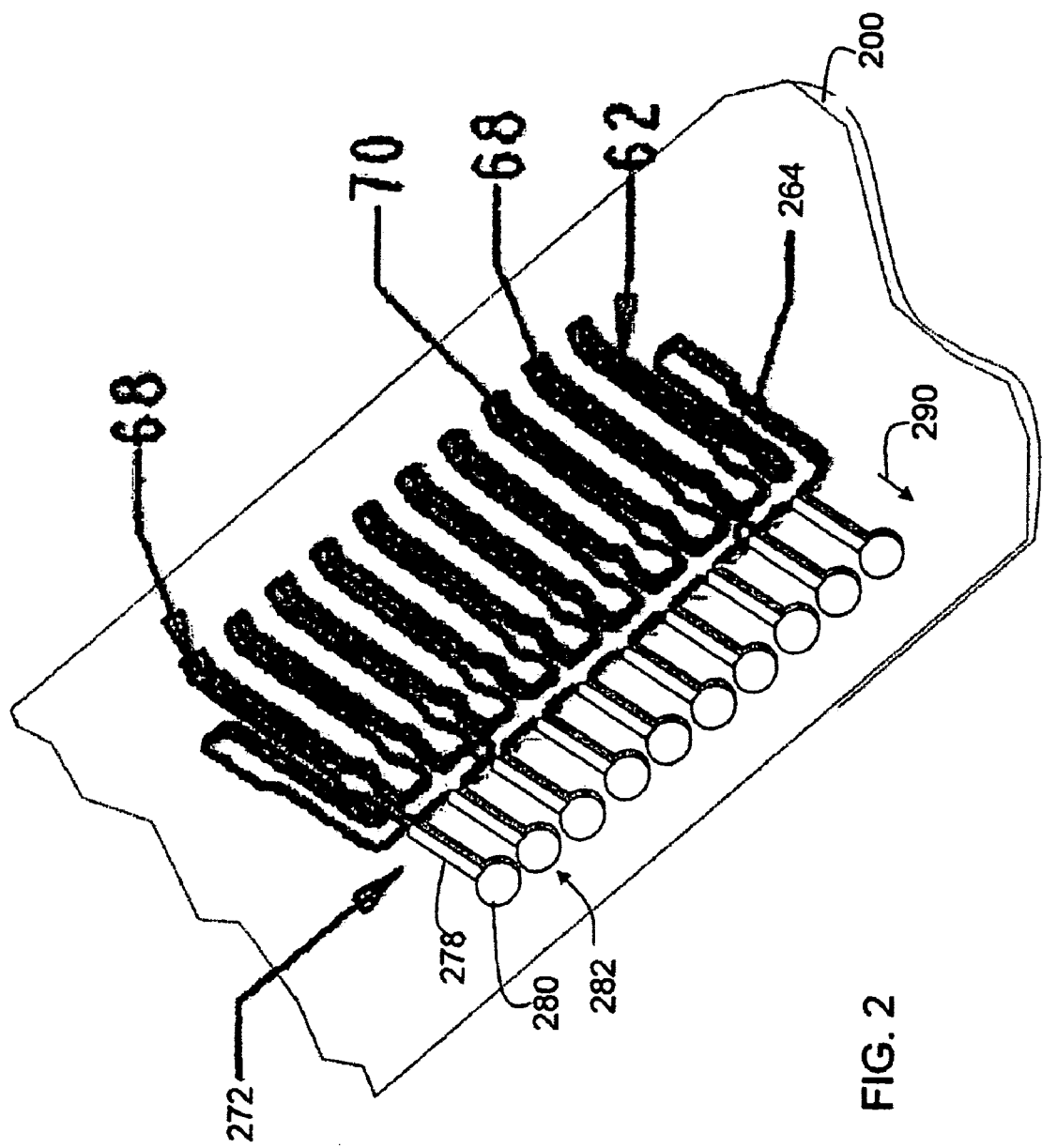
FIG. 2 is a sketch of a lead frame according to an embodiment of the invention.

FIG. 2 shows an alternative design for a lead frame that both avoids the need to precisely position contact tails with a forming operation and also is more tolerant of variations in the process of manufacturing electronic assemblies than prior art lead frames. Lead frame 264 has contact tails 272 that may be attached to pads on the surface of a substrate and may be used in a component in place of lead frame 64.

As with lead frame 64, lead frame 264 contains a plurality of conductors 62. Each of the conductors 62 includes a mating contact portion 68 and an intermediate portion 70. In this example, the mating contact portions and intermediate portions of the conductors 62 in lead frame 264 have the same shape as in lead frame 64 (FIG. 1A). However, these portions may have any desired shape appropriate for the functionality of the component in which lead frame 264 is used. For example, mating contact portions 68 may include compliant sections or be in any other shape to make a separable electrical connection with a signal conductor in a mating connector. As another example, mating contact portions 68 may be designed to contact balls, leads, pads or other structures on semi-conductor chips to be held in a chip socket incorporating lead frame 264.

Contact tails 272 have a shaft portion extending in direction 290 from intermediate portions 70. In the illustrated embodiment, the shaft of each signal conductor is in the form of post 278. When lead frame 264 is held within a housing forming an electrical component, post 278 may extend from the housing in direction 290.

Each post 278 widens into a distal portion that has a greater surface area per length in direction 290 than post 278. In the embodiment illustrated, each distal portion is in the shape of paddle 280. As can be seen in the embodiment of FIG. 2, each paddle 280 has a width greater than the width of posts 278. In this configuration, when the contact tail 272 is mounted on a substrate, the major surface of the paddle 280 is perpendicular to the substrate surface and only an edge 282 lays parallel to the substrate surface. This is distinguished from the configuration of FIGS. 1A-1B where the whole pad 80 lays parallel to the substrate surface.

In the illustrated embodiment, lead frame 264 is made from a sheet of metal 200 (shown in phantom). Lead frame 264 may be stamped from sheet 200. As a result, each paddle has a major surface parallel to direction 290 and an edge 282 that is orthogonal to that direction.

If a coating over any portion of contact tail 272 is desired, that coating may be applied to sheet 200 before stamping or may be applied to contact tail 272 after stamping. Coatings may be used to reduce oxide formation, reduce solder wicking or for other purposes.

If desired, mating contact portion 68 and intermediate portion 70 may be formed to have curves or other structural features as appropriate for the intended application of lead frame 264. However, in the illustrated embodiment, contact tails 272 are not formed. Rather, all dimensions of the contact tails 272 may be defined in a stamping operation, which is inherently more precise than a forming operation.

Lead frame 264 may be incorporated into an electronic component, which may then be attached to a substrate, such as a printed circuit board, FIG. 3A shows a contact tail 272 of such a component as it is being attached to a printed circuit board 300. In this illustration, circuit board 300 includes a pad 302 joined to trace 306 internal to printed circuit board 300 by via 304. Circuit board 300 may be a printed circuit board formed using conventional processing, but any suitable substrate may be used.

Solder paste 310 is placed on pad 302 as is conventional in a surface mount manufacturing process. Solder paste 310 may be applied in any suitable way, such as by screening or with a solder paste dispenser. When an electronic component containing contact tail 272 is placed on circuit board 300, paddle 280 is inserted in solder paste 310. FIG. 3A illustrates contact tail 272 after a component is placed on circuit board 300, but before solder paste 310 is reflowed.

Contact tail 272 is shown to be a portion of a signal conductor 262 that is mounted within housing 350 of an electronic component. In the illustrated embodiment, signal conductor 262 includes retention features 366 intended to retain signal conductor 262 within housing 350. Retention features 366 may be stamped along with contact tail 272. As a result, distance $D_1$ between retention feature 366 and edge 282 of paddle 280 facing circuit board 300 is defined during the stamping operation.

Similarly, the distance $D_2$ defining the position of edge 282 relative to lower surface 352 is well controlled. If housing 350 includes a shoulder or other feature that serves to set the spacing of lower surface 352 from the upper surface of printed circuit board 300, a well-controlled tolerance on the distance $D_2$ increases the likelihood that paddle 280 will be accurately positioned relative to solder paste 310. Accurate positioning of paddle 280 relative to solder paste 310 increases the robustness of a solder joint formed when solder paste 310 is reflowed.

As one example, the dimension $D_2$ may be between about 20 and 60 mils (0.5 to 1.5 mm). $D_1$ may be between about 30 and 100 mils (0.7 to 2.5 mm). Post 278 may have a width of about 4 to 12 mils (0.1 to 0.3 mm) and paddle 280 may have a width of about 8 to 35 mils (0.2 to 0.9 mm).

The shape of contact tails 272 may also increase the robustness of solder joints formed. In the illustrated embodiment, edge 282 is curved. This curve provides a ready path for volatized flux or other gases within solder paste 310 to escape from solder paste 310 as it becomes molten. In contrast to designs having contact tails with pads parallel to the printed circuit board, the design as illustrated traps less gas and therefore solder joints formed using contact tails 272 are less likely to contain voids.

Other aspects of contact tails 272 may also lead to more robust joints. The shape of contact tail 272 dictates the regions into which molten solder will wick when solder paste 310 is reflowed. Contact tail 272 may be shaped to direct solder into regions that form a robust joint. Conversely, solder may be directed away from regions where the solder could interfere with operation of an electronic assembly. As shown in FIG. 3B, when solder paste 310 reflows, the molten solder will adhere to contact tail 272 to form two well-defined heels 320A and 320B along the curved edge 282. Similarly, FIG. 3C, showing a side view of contact tail 272, illustrates two well-defined solder fillets 320C and 320D formed along the flat surface of paddle 280.

In the embodiment shown in FIGS. 3A, 3B and 3C, the wicking action that draws solder towards contact tail 272 also draws the solder away from via 304. In prior art designs, vias beneath surface mount pads were avoided because solder could be drawn into the vias, leaving too little solder on the pad to form a reliable joint. With wicking action drawing molten solder into well-defined heels 320A and 320B and well-defined fillets 320C and 320D instead of into a via, a via 304 may be placed beneath pad 302 without compromising the reliability of a solder joint formed on pad 302. The ability to place vias beneath the joint region of a pad reduces the area needed to mount a component.

In the embodiment pictured in FIGS. 3A to 3C, contact tail 272 is shaped to provide a high solder affinity, thus shaping a solder joint formed around the contact tail. The pictured embodiment shows the contact tail positioned precisely relative to a pad on a substrate, but this positioning is not required. Even greater advantage may be obtained in shaping the solder joint when the contact tail is not initially positioned precisely relative to the pad and solder paste on the pad.

The high solder affinity of contact tail 272 can also create a solder joint with a shape that provides a robust joint even if the contact tail is not positioned accurately relative to the pad or other variations occur in the process of manufacturing an electronic assembly. FIGS. 4A and 4B illustrate that contact tails such as 472A, 472B, 472C and 472D produce reliable solder joints even when contact tails are misaligned relative to pads such as pads 402A, 402B, 402C and 402D. Further, reliable solder joints are produced even if there are other variations in the manufacturing process, such as variations in the volume of solder paste positioned on the pads.

In the example shown in FIGS. 4A and 4B, contact tail 472A is shown with paddle 480A inserted into solder paste 410A. In this illustration, paddle 480A is offset slightly from pad 402A and solder paste 410A has a volume sufficient to cover the lower portion of paddle 480A. This positioning of paddle 480A and volume of solder paste 410A may represent nominal design values for both the position of a contact tail and the volume of solder paste. However, in an actual electronic assembly, there will be variations from the nominal design values both in the positioning of the contact tail and the volume of solder paste on each pad. Nonetheless a reliable solder joint may be formed.

For example, contact tail 472B is shown with a lower position than contact tail 472A. Though solder paste 410B has the same volume as solder paste 410A, the difference in position between contact tail 472B and contact tail 472A means that solder paste 410B covers a larger percentage of the surface area of paddle 480B.

As an example of another possible variation, contact tail 472C is shown positioned further from pad 402C than the nominal design value. With this positioning, only a relatively small portion of paddle 480C is inserted into solder paste 402C.

As an example of yet another possible variation, contact tail 472D is shown to be positioned relative to pad 402D with the nominal design value. However, because of the greater volume of solder paste 410D, solder paste 410D covers a larger percentage of the surface area of paddle 480D than the percentage of paddle 480A covered by solder paste 410A.

FIG. 4B shows printed circuit board 400 following reflow. Despite variations in the relative positioning of the contact tail relative to the solder paste for each of contact tails 472A, 472B, 472C and 472D, a reliable solder joint is formed in each case. As shown in FIG. 4B, solder paste 410A when reflowed forms a solder fillet 420A that has well-defined heels. Such a solder fillet creates a solder joint with desirable electrical and mechanical properties.

Despite the fact that contact tail 472B extends further into solder paste 410B than contact tail 472A extends into solder paste 410A, upon reflow, solder paste 410B also forms a reliable joint. In some prior art manufacturing processes, having a lead extend too deeply into solder paste before reflow can allow solder to wick up the lead or smear the solder onto adjacent pads. The same propensity exists for solder to wick up post 478B. However, the transition between post 478B and paddle 480B creates a region in which retention fillet 422B forms. As excess solder wicks out of the joint area, it is retained as retention fillet 422B and does not wick up post 478B far enough to interfere with operation of an electronic component.

Contact tail 472C presents an opposite problem. Contact tail 472 is not inserted sufficiently deeply into solder paste 410C. However, the wicking action of solder paste 410C upon reflow nonetheless forms a solder joint between paddle 480C and pad 402C.

The ability of contact tails such as contact 472D to retain solder and prevent it from wicking up post 478D is also beneficial when excess solder paste is placed on the pad. As illustrated in FIG. 4A, solder paste 410D has a greater volume than the nominal value. However, rather than wick up post 470D or spread off of pad 402D, excess solder wicks up contact tail 472D and forms retention fillet 422D. Retention fillet 422D precludes solder from wicking up post 478D or smearing onto adjacent pads and interfering with operation of the electronic component of which solder tails 472A, 472B, 472C and 472D are a part.

Figures 5A, 5B:
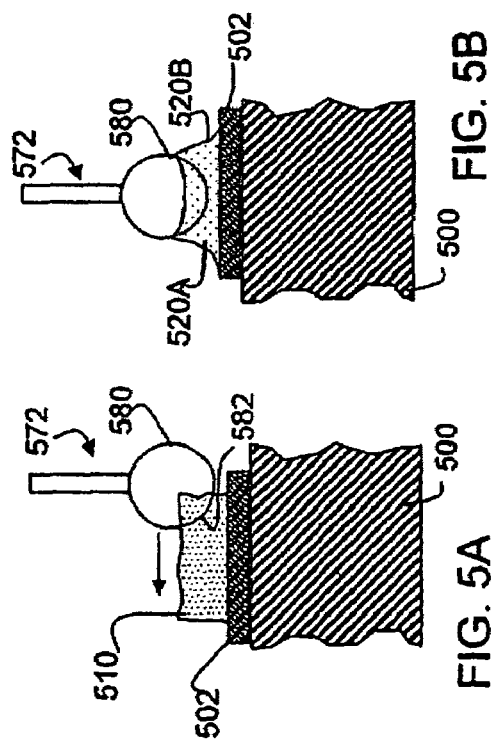
FIG. 5A is a sketch of a contact tail in a stage of manufacture of an electronic assembly.
FIG. 5B is a sketch of the contact tail of FIG. 5A in a subsequent stage of manufacture of an electronic assembly.
Figure 5C:
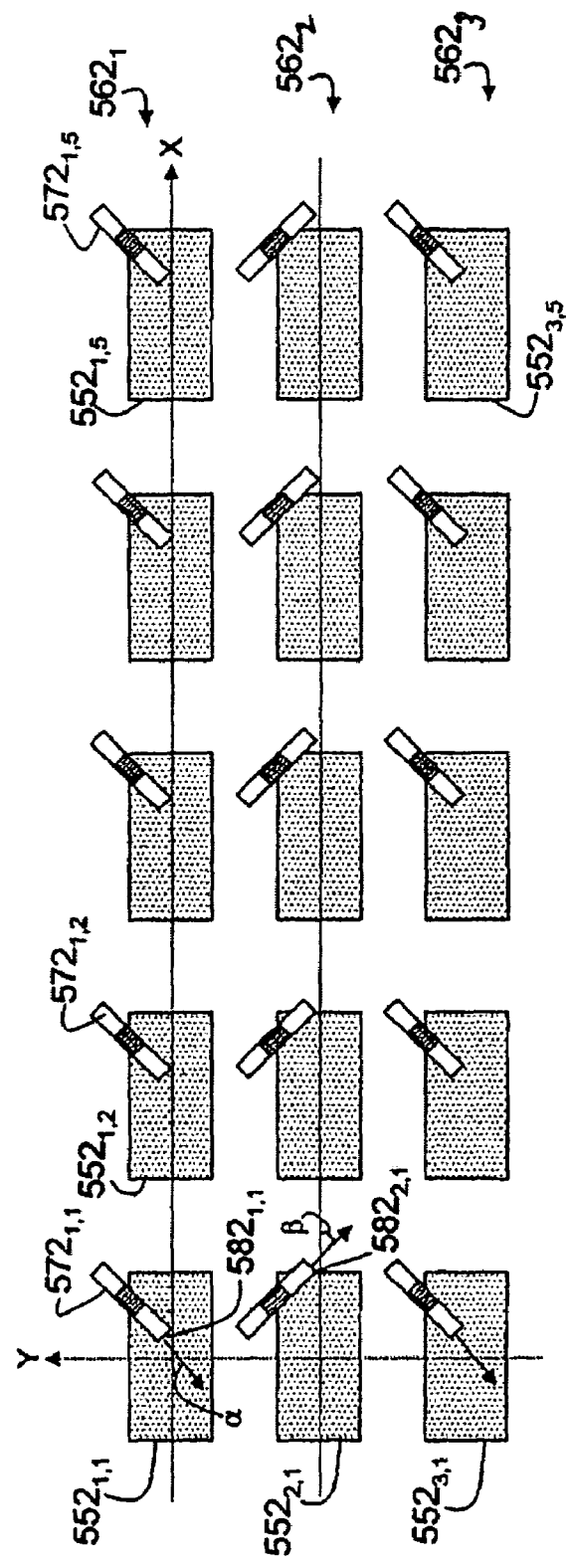
FIG. 5C is a top view of an array of contact tails according to an embodiment of the invention.

FIGS. 4A and 4B provide an example of how the design of a contact tail may create reliable solder joints despite variations in the manufacturing process of an electronic assembly. Contact tails as described herein may also lead to the formation of reliable joints despite variations that cause inaccurate positioning of components relative to pads on a substrate. FIGS. 5A-5C illustrate self-alignment that may occur with a contact tail having high affinity to solder. The same attractive forces that cause solder to wick may also move the contact tail to a position in which the forces on the contact tail are balanced. If the contact tail is symmetrical, such forces can center the contact tail on a pad and increase the likelihood that a reliable solder joint will be formed.

FIG. 5A shows a single contact tail 572 that may form a portion of an electronic component. FIG. 5A illustrates positioning of contact tail 572 when that electronic component is placed on a printed circuit board 500. Printed circuit board 500 includes a pad 502, which is intended to be soldered to contact tail 572. In the stage of manufacture illustrated in FIG. 5A, pad 502 contains solder paste 510. In this example, the electronic component of which contact tail 572 is a part is mis-positioned relative to pad 502. Rather than being centered on pad 502, only a portion of paddle 580 is inserted within solder paste 510.

Despite the mis-positioning of contact tail 572 relative to pad 502, the affinity of molten solder to contact tail 572 and pad 502 creates a force on contact tail 572 that draws contact tail 572 toward pad 502. Forces on contact tail 572 will be balanced when contact tail 572 is centered in the solder on pad 502. As a result, when solder paste 510 is reflowed and allowed to cool, contact tail 572 will be positioned as illustrated in FIG. 5B. Contact tail 572, and the electronic component of which contact tail 572 is a part, has been repositioned such that contact tail 572 is generally centered on pad 502 with symmetrical solder fillets 520A and 520B.

FIG. 5C illustrates this self-centering principle applied to an electronic component having an array of contact tails such as may be used to replace a ball grid array in a connector or other electrical component. In this example, a substrate includes a rectangular array of pads $552_{1,1}$ to $552_{3,5}$ (of which only a portion are numbered). In the illustrated embodiment, the pads are arranged in a rectangular array along axes designated X and Y. The contact tails $572_{1,1}$ to $572_{3,5}$ are similarly positioned in a rectangular array intended to align with the array of pads. However, as shown in FIG. 5C, a component has been placed slightly out of position so that contact tails $572_{1,1}$ to $552_{3,5}$ are not centered on pads $552_{1,1}$ to $552_{3,5}$. Attractive forces between the molten solder and contact tails may be used to align the component to the pads.

Contact tails $572_{1,1}$ to $572_{3,5}$ may be shaped similar to contact tail 572 (FIG. 5A). In the illustrated embodiment, the attractive force between solder on pad 502 (FIG. 5A) and paddle 580 (FIG. 5A) is greatest along the curved edge 582 (FIG. 5A) of paddle 580. Therefore, it may be desirable in some embodiments to orient contact tails $572_{1,1}$ to $572_{3,5}$ within an array such that different ones of the edges $582_{1,1}$ to $582_{3,5}$ have different orientations to ensure that at least some of the contact tails are pulled to the desired location. In the illustrated embodiment, the edges $582_{1,1}$ to $582_{3,5}$ are not normal to either the X or Y axis of the array of pads $552_{1,1}$ to $552_{3,5}$. In this way, the self-positioning characteristic of the contact tails may align the array of contact tails with the array of pads regardless of whether the misalignment is in the X direction, the Y direction or both.

Further, not all of the contact tails have the same orientation. In the embodiment of FIG. 5C, the array of contact tails $572_{1,1}$ to $572_{3,5}$ is laid out in rows $562_1$, $562_2$, $562_3$. The contact tails in each row may have the same orientation relative to the X, Y grid. The contact tails in adjacent rows may have different orientations. Such a configuration may be desirable for an electronic component assembled from wafers, such as is pictured in FIG. 1B. In this example, contact tails in rows $562_1$ and $562_3$ are oriented with the normal to edges $582_{1,1}$ to $582_{1,5}$ oriented at an angle a relative to the X axis. Each of the contact tails in row $562_2$ has the normal to its edge $582_{2,1}$, $582_{2,5}$ oriented at an angle β relative to the X axis. The angles α and β are shown to have approximately equal magnitudes with opposite signs, with each having a magnitude of approximately 45°. However, any suitable angles may be used and the angles may be different in each row.

Orienting each contact tail with the normal to its edges 582 angularly offset from the axes of the array of pads increases the affinity for centering the contact tails relative to the pads regardless of whether the array of contact tails is offset from the array of pads in the X or Y direction. By incorporating different orientations in different rows, the affinity for centering the array of contact tails relative to the array of pads may be increased regardless of the direction in which the array of contact tails is offset from the array of pads.

Turning now to FIGS. 6A-6K, alternative embodiments of a contact tail, such as contact tail 272 (FIG. 2) are shown. Each of the contact tails in FIGS. 6A-6K may be manufactured by stamping the contact tail from a sheet of metal. Each of the pictured contact tails may be a portion of a signal conductor for use in an electronic component. Each may be manufactured as part of a lead frame or other structure to facilitate manufacture of the electronic component. FIGS. 6A-6K are illustrative of the various shapes in which a contact tail may be made.

FIG. 6A shows a contact tail 672A. Contact tail 672A has a shape similar to contact tail 272 (FIG. 2) with a generally circular paddle 680A. In the embodiment of FIG. 6A, a solder pre-form 612 is attached to paddle 680A. A contact tail such as contact tail 672A with a solder pre-form attached may be used to manufacture an electronic assembly in which electronic components are soldered to a substrate without first depositing solder paste on pads of the substrate. When reflowed, solder pre-form 612 will become molten, forming solder fillets attaching contact tail 672A to a pad.

FIG. 6B shows an alternative embodiment of a contact tail. In the embodiment illustrated in FIG. 6B, contact tail 672B has a hole 684B formed through it. Hole 684B may be manufactured in any suitable way. For example, hole 684B may be created by drilling or punching through paddle 680B and may be created as part of the same stamping operation used to create contact tail 672A. When paddle 680B is inserted into solder paste which is then reflowed, molten solder may fill hole 684B. Having solder extend through-hole 684B may strengthen the mechanical connection between contact tail 72B and the substrate to which it is mounted. In the embodiment shown, hole 684B is at the lower portion of paddle 680B. However, hole 684B may be positioned in any portion of paddle 680B.

FIG. 6C shows a contact tail 672C. As in the embodiments in FIGS. 6A and 6B, contact tail 672C has a generally disk-shaped paddle 680C. Hole 684C is punched in paddle 680C. In this embodiment, hole 684C intersects the perimeter of paddle of 680C, forming a slot in paddle 680C. The remaining material of paddle 680C has a J-shaped profile. By appropriate selection of the size of hole 684C relative to the size of paddle 680C, paddle 680C may have flexibility that mimics the flexibility of a J-lead but is created without a forming operation.

In a contemplated embodiment, the contact tails shown in FIGS. 6C-6I are stamped from a metal sheet. Therefore, only the outline of the stamped contact tails is shown as each will be generally planar. Though not expressly shown in FIGS. 6C-6I, each of the contact tails pictured will have a thickness approximately equal to the thickness of the metal sheet from which the contact tails are stamped. In some contemplated embodiments, each contact tail will have a thickness of between about 4 and 12 mils (0.1 to 0.3 mm).

FIG. 6D shows a further possible embodiment. Contact tail 672D has a lower edge 682D. As described above, lower edge 682D faces the substrate when contact tail 672D is mounted to the substrate. Edge 682D presents a relatively small surface area of contact tail 672D to the solder securing the contact tail to a pad. This relatively small surface area reduces the likelihood that gas will be trapped in the molten solder during reflow to create voids in the solder joint holding contact tail 672D to the pad. A curved edge 682D further reduces entrapment of gas within the molten solder because gas will generally follow the curved edge to the surface of the molten solder, where the gas escapes. Accordingly, embodiments illustrated above that include a generally circular paddle reduce the entrapment of gases in the solder joint.

It is not necessary, however, that the paddle of the contact tail be circular. In the embodiment of FIG. 6D, Contact tail 672D has a lower edge 682D of radius $R_1$. The upper edge 686D is also curved but has a larger radius, here illustrated as radius $R_2$. Creating upper edge 686D with a larger radius can create a larger solder retention area 688D above upper edge 686D. Additionally, creating upper edge 686D with a larger radius forms a more acute angle between post 678D and upper edge 686D. Creating a more acute angle increases the affinity for molten solder to be retained in solder retention area 688D.

FIG. 6E shows a contact tail 672E with a larger retention area 688E. In this embodiment, upper edge 686E is relatively flat and perpendicular to post 678E.

FIG. 6F shows a further embodiment. Contact tail 672F includes a post 678F with multiple bends. The serpentine shape of post 678F provides flexibility. Such flexibility may be desirable to absorb thermal stress created by different rates of thermal expansion between an electrical component with an array of contacts and a substrate. Preferably, post 678F is created as part of the same stamping operation that creates paddle 680F. Even though contact tail 672F may provide flexibility, similar to a formed lead, it provides the tight manufacturing tolerances available through a stamping operation.

FIG. 6G shows a contact tail 672G. Contact tail 672G includes a paddle 680G having indented side portions 690G. Indented side portions 690G create additional solder retention areas 692G. Additional solder retention areas 692G may increase the volume of solder that adheres to paddle 680G and therefore reduce the likelihood that solder will interfere with operation of an electronic component by wicking up post 678G or smearing out of the solder joint region.

FIG. 6H illustrates yet a further embodiment of a contact tail. Contact tail 672H includes a lower edge 682H with a discontinuous portion 690H. The discontinuous portion 690H is formed by removing a lens shaped portion from an otherwise circular paddle as shown in FIG. 6A. FIG. 6H demonstrates that the edge of contact tail 672H facing a printed circuit board does not need to be round. Contact tail 672H is just one example of possible alternative embodiments without a rounded edge. As another example, discontinuous portion 690H may form a slot extending further into paddle 680H.

FIG. 6I illustrates a contact tail 672I having a paddle 680I. In this embodiment, paddle 680I is generally circular. FIG. 6I illustrates that edge 682I of paddle 680I need not press directly against a pad on a substrate. In the illustrated embodiment, projection 692I extending from paddle 680I will be positioned between edge 682I and a pad on a substrate to which contact tail 672I may be mounted. Projection 692I may be created in the same stamping operation used to form paddle 680I.

FIGS. 6J and 6K illustrate further alternative embodiments of a contact tail. In the embodiments described above, each of the contact tails is created in a stamping operation. Though forming was described to shape the mating contact portions and intermediate portions of signal conductors, in the above-described embodiments, no part of the contact tail was shaped in a forming operation. FIGS. 6J and 6K demonstrate that lack of a forming operation need not be a limitation on the invention. In the embodiment of FIG. 6J, contact tail 672J is shown in a top view. In this view, it can be seen that paddle 680J may be formed to include a curve. Such a curve may, for example, be desirable to allow paddle 680J to have a larger surface area without requiring a wider pad. In the illustrated embodiment, no curves in direction 290 (FIG. 2) of shaft 678J are formed. As a result, dimensions along post 278J, such as distance $D_1$ and $D_2$ (FIG. 3A), are defined with the high precision of a stamping operation.

FIG. 6K shows a further embodiment in which portions of contact tail 672K are formed. In the embodiment illustrated in FIG. 6K, paddle 680K is folded about the axis of post 678K. As is the case with contact tail 672J, such a configuration shapes the solder joint mounting paddle 680K to a pad. The fold in paddle 680K may increase the surface area of paddle 680K. Alternatively, the fold may create a corner or similar structure that retains solder, thereby increasing the percentage of the solder in a solder joint retained adjacent paddle 680K. With such a configuration, there is a corresponding decrease in the percentage of solder that may wick out of the area of the solder joint and interfere with operation of an electronic component.

Having thus described several aspects of at least one embodiment of this invention, it is to be appreciated various alterations, modifications, and improvements will readily occur to those skilled in the art.

For example, contact tails are described for use on signal conductors in electrical connectors. However, their use is not limited to that application. Contact tails according to the invention may be used in conjunction with ground leads, shields, plates or other conductive members within an electrical connector. Likewise, the contact tails may be used in conjunction with other components, such as chip sockets, chip carriers and semiconductor devices.

Such alterations, modifications, and improvements are intended to be part of this disclosure, and are intended to be within the spirit and scope of the invention. Accordingly, the foregoing description and drawings are by way of example only.

What is claimed is:

1. A contact tail for a conductive member in an electronic component, the contact tail comprising:
    a) a shaft portion adapted to extend from the component in a first direction, the shaft portion having a first width normal to the first direction; and
    b) a distal portion attached to the shaft portion, the distal portion having:
        i) a major surface parallel to the first direction;
        ii) a second width in a direction normal to the first direction, wherein the second width is greater than the first width; and
        iii) an edge, normal to the first direction and disposed opposite the shaft portion; wherein the edge is curved and adapted to be soldered to a surface of a board.

2. The contact tail of claim 1, wherein the distal portion has a substantially circular perimeter.

3. The contact tail of claim 2, wherein the distal portion is a disk.

4. The contact tail of claim 3, wherein the distal portion has an opening formed therethrough.

5. The contact tail of claim 4, wherein the disk has an interior portion and the opening is within the interior portion.

6. The contact tail of claim 4, wherein the disk has an upper portion proximate the shaft portion and the opening intersects the perimeter in the upper portion.

7. The contact tail of claim 1, wherein the shaft has a compliant feature formed therein.

8. The contact tail of claim 1, wherein the shaft has a curved region formed therein.

9. The contact tail of claim 1, wherein the contact tail is symmetrical about an axis through the shaft portion and parallel to the first direction.

10. The contact tail of claim 1, forming an electronic assembly in combination with:
   a) a substrate having a surface with a conductive pad formed on the surface;
   b) an electronic component comprising the contact tail with the edge adjacent the pad at the surface of the substrate; and
   c) solder, electrically and mechanically joining the distal portion to the pad.

11. The electronic assembly of claim 10, wherein the solder comprises a plurality of solder heels formed between the edge and the pad.

12. The electronic assembly of claim 11, wherein:
   the distal portion further comprises a second surface, parallel to the major surface, with each of the major surface and the second surface bounded at least in part by the edge; and
   the solder comprises a first fillet bridging the major surface to the pad and a second fillet bridging the second surface to the pad.

13. The electronic assembly of claim 10, comprising a via through the pad adjacent the edge.

14. A method of forming the electronic assembly of claim 10, comprising:
   a) positioning solder paste on the pad;
   b) inserting at least a portion of the distal portion into the solder paste; and
   c) reflowing the solder paste to form the solder.

15. An electronic component comprising a plurality of leads each having a contact tail as recited in claim 1, with a first portion of the plurality of leads disposed along a first row, the first row extending in a second direction, perpendicular to the first direction, with the edges of each of the leads in the first row positioned in parallel and angularly offset from the second direction by a first angle.

16. The electronic component of claim 15, wherein a second portion of the plurality of leads is disposed along a second row, the second row parallel to the first row, with the edges of each of the leads in the second row positioned in parallel and angularly offset from the second direction by a second angle, opposite of the first angle.

17. A contact tail for a conductive member in an electronic component, the contact tail comprising:
   a) a shaft portion adapted to extend from the component in a first direction; and
   b) a distal portion, having a first edge and a second edge, the first edge and the second edge being separated in the first direction and disposed on opposing sides of the distal portion, the distal portion being attached to the shaft portion at the second edge, with the second edge extending beyond the shaft in at least one direction transverse to the first direction; wherein the first edge is curved and adapted to be soldered to a surface of a board.

18. The contact tail of claim 17, wherein the second edge intersects the shaft at an obtuse angle.

19. The contact tail of claim 17, wherein the second edge is curved.

20. The contact tail of claim 17, wherein the second edge is curved, with the second edge having a radius of curvature that is greater than or equal to a radius of curvature of the first edge.

21. The contact tail of claim 17 forming an electronic assembly in combination with:
   a) a substrate having a surface with a conductive pad formed on the surface;
   b) an electronic component comprising the contact tail with the first edge adjacent the pad at the surface of the substrate; and
   c) solder, electrically and mechanically joining the distal portion to the pad.

22. The electronic assembly of claim 21, wherein the solder comprises at least one region between the second edge and the shaft.

23. The electronic assembly of claim 22, wherein the solder further comprises a plurality of solder heels formed between the first edge and the pad.

24. The electronic assembly of claim 23, wherein the distal portion comprises a first surface and a second surface, parallel to the first surface, with each of the first surface and the second surface bounded by the edge and the solder comprises a first portion bridging the first surface to the pad and a second portion bridging the second portion to the pad.

25. The electronic assembly of claim 22, comprising a via through the pad adjacent the edge.

26. A method of forming the electronic assembly of claim 22, comprising:
   a) positioning solder paste on the pad;
   b) inserting at least a portion of the distal portion into the solder paste; and
   c) reflowing the solder paste to form the solder.

27. A method of forming a contact, the method comprising:
   a) stamping from a sheet of metal a contact with a contact tail in an electronic component comprising:
      i) a shaft portion adapted to extend from the component in a first direction, the shaft portion having a first width normal to the first direction; and
      ii) a distal portion, attached to the shaft portion, the distal portion having a second width normal to the first direction, greater than the first width, and an edge, normal to the first direction; wherein the edge is curved and adapted to be soldered to a surface of a board.

28. The method of claim 27, further comprising:
   b) punching a hole in the distal portion.

29. The method of claim 27, further comprising:
   b) plating the contact.

30. The method of claim 29, wherein the act b) comprises plating the sheet of metal before the act a) of stamping.

31. The method of claim 27 that is substantially free of a bending step.

* * * * *